United States Patent [19]

Asada et al.

[11] Patent Number: 6,060,165
[45] Date of Patent: *May 9, 2000

[54] METAL POWDER AND PROCESS FOR PREPARING THE SAME

[75] Inventors: Eiichi Asada, Tokyo; Yuji Akimoto, Fukuoka; Fumiyuki Shimizu, Chikushino; Kazuro Nagashima, Ohnojo, all of Japan

[73] Assignee: Shoei Chemical Inc., Tokyo, Japan

[*] Notice: This patent is subject to a terminal disclaimer.

[21] Appl. No.: 08/933,907

[22] Filed: Sep. 23, 1997

[30] Foreign Application Priority Data

Jun. 2, 1997 [JP] Japan ................................. 9-157341

[51] Int. Cl.$^7$ ................................. B32B 5/16; B05D 7/00
[52] U.S. Cl. ........................ 428/403; 428/404; 428/328; 174/257; 252/514; 427/212; 427/216; 427/226; 427/229
[58] Field of Search ................................. 428/403–406, 428/328; 252/514, 518.1; 174/253–254, 255, 257; 427/212, 216, 226, 229

[56] References Cited

U.S. PATENT DOCUMENTS

| | | | |
|---|---|---|---|
| 4,122,232 | 10/1978 | Kuo | 428/323 |
| 4,415,486 | 11/1983 | Boonstra | 252/514 |
| 5,439,502 | 8/1995 | Kodas et al. | 75/365 |
| 5,871,840 | 2/1999 | Asada | 428/328 |

FOREIGN PATENT DOCUMENTS

| | | |
|---|---|---|
| 0 067 474 | 12/1982 | European Pat. Off. . |
| 0 088 992 | 9/1983 | European Pat. Off. . |
| 0 091 109 | 10/1983 | European Pat. Off. . |
| 54-120640 | 9/1979 | Japan . |
| 60-16041 | 4/1985 | Japan . |
| 63-131405 | 6/1988 | Japan . |
| 63-31522 | 6/1988 | Japan . |
| 2-194137 | 7/1990 | Japan . |
| 4-43504 | 2/1992 | Japan . |
| 04 202602 | 7/1992 | Japan . |
| 6-172802 | 6/1994 | Japan . |
| 6-279816 | 10/1994 | Japan . |

*Primary Examiner*—Timothy Speer
*Assistant Examiner*—Bryant Young
*Attorney, Agent, or Firm*—Flynn, Thiel, Boutell & Tanis, P.C.

[57] ABSTRACT

A metal powder having a vitreous thin layer on at least a part of the surface thereof wherein the amount of the vitreous thin layer is preferably 0.01 to 50% by weight based on the metal powder without the vitreous thin layer. The metal powder is prepared by a process comprising the steps of: bringing a solution comprising a heat-decomposable metal compound to fine droplets; and heating the droplets to a temperature above the decomposition temperature of the metal compound, wherein a precursor of an oxide, heat-decomposable to produce a vitreous material which, together with the metal, does not form a solid solution, is added to the solution and the vitreous material is deposited, upon the heating, in the vicinity of the surface of the metal powder. The powder is useful for the preparation of a thick film paste used in a multilayer ceramic electronic component or substrate, since it has an excellent oxidation resistance during storage, in a conductor paste, and during firing of the paste.

13 Claims, No Drawings

METAL POWDER AND PROCESS FOR PREPARING THE SAME

BACKGROUND OF THE INVENTION

1. Field of the Invention

The present invention relates to a novel metal powder particularly suitable for a thick film paste and a process for preparing the same, and also to a conductor paste using the metal powder and a multilayer electronic component or a multilayer substrate comprising a conductor formed using the paste.

2. Description of the Prior Art

In the field of electronics, thick film pastes, such as conductor pastes and resistor pastes, have been used for the production of electronic circuits and components, such as resistors, capacitors, and IC packages. The thick film paste is prepared by homogeneously mixing and dispersing a conductive powder, such as a metal, an alloy, or a metal oxide, optionally together with a vitreous binder or other additive(s), in an organic vehicle to prepare a paste. It, after application onto a substrate, is fired at a high temperature to form a conductor film or a resistor film.

Conductive metal powders which are commonly used in the conductor paste or the resistor paste include powders of noble metals, such as silver, gold, platinum, and palladium, and base metals, such as copper, nickel, cobalt, iron, aluminum, molybdenum, and tungsten, or alloys of the above metals.

Among them, in particular, base metal powders are likely to be oxidized during firing and, hence, heated in an oxidizing atmosphere, up to the step of removing the binder at a temperature of usually about 300 to 600° C., to completely burn out the organic vehicle in the paste. Thereafter, they are fired in an inert or reducing atmosphere, such as nitrogen or hydrogen-nitrogen, and, if necessary, the metal, which has been oxidized during the step of removing the binder, is subjected to a reduction treatment. However, oxidation of the base metal to some extent is unavoidable, even by the above method, resulting in deteriorated conductivity and solderability. Further, reduction as the post treatment and strict control of the atmosphere and firing parameters are necessary, leading to a complicated process and increased cost. Therefore, at least the oxidation of the metal powder during the step of removing the binder in an oxidizing atmosphere should be minimized.

In multilayer ceramic electronic components, such as multilayer capacitors, an unfired dielectric layer and an internal conductor paste layer are alternately put on top of the other to form a plurality of layers, and these layer are then co-fired at a high temperature. In this case, ceramics used as a dielectric material, such as barium titanate, titanium oxide, and a composite perovskite containing lead, when fired in a reducing atmosphere, causes an oxygen deficiency, frequently resulting in deteriorated dielectric properties, which poses a reliability problem. Therefore, firing in an oxidizing atmosphere is preferred until the temperature reaches a value at which the ceramic layer is sintered and densified. For this reason, the development of a base metal paste as an internal conductor material, which can be fired in an oxidizing atmosphere, has been desired in the art.

On the other hand, also in the case of a noble metal powder, when a metal (for example, palladium or palladium alloy), which is oxidized at a relatively low temperature and then is reduced by further heating to a higher temperature, is used as an internal conductor of a multilayer ceramic component or as an internal wiring conductor of a multilayer ceramic substrate, volume expansion of the electrode derived from oxidation of the metal and subsequent reduction shrinkage occur during firing. It is known that this volume change is not coincident with the shrinking behavior during the sintering of the ceramic layer and, hence, is likely to cause delamination and cracking. This problem occurs also in the case of the above easily oxidizable base metals, such as copper and nickel. Therefore, in both the noble metal and base metal, the oxidation and reduction of the metal powder during the firing is preferably inhibited as much as possible.

As described in Japanese Patent Publication No. 16041/1985 and Japanese Patent Laid-Open Nos. 131405/1988 and 194137/1990, addition of an element or a metal oxide, which is selectively oxidized during firing, to a conductor paste has been attempted to prevent the oxidation of the metal powder. Depending upon the mixed state of the paste, however, the additive does not effectively act on the surface of the metal powder. Therefore, when the amount of the element or the metal oxide is small, the antioxidation effect is unsatisfactory. On the other hand, addition of a large amount of the element or the metal oxide leads to a deteriorated conductivity and solderability and increased impurities to deteriorate the properties of the electronic components. Further, the metal oxide produced during firing inhibits the sintering of the metal powder, often making it impossible to provide a conductor film having satisfactorily low resistance.

Further, there is a method, as described in Japanese Patent Laid-Open No. 120640/1979, wherein an element, which is preferentially oxidized to form a vitreous material, such as carbon, boron, silicon or aluminum, is alloyed with a conductive metal. However, the alloying element remains in the conductor film after the firing, increasing the resistivity of the resultant conductor. Further, vitrification during the firing requires heat treatment at a temperature considerably above the softening temperature of the glass, making it difficult to control firing conditions and the regulation of the composition and amount. Further, at the present time, there are few processes which can efficiently prepare a fine alloy powder of a submicron size necessary for a reduction in thickness of the conductor layer and a reduction in resistance.

Japanese Patent Laid-Open No. 43504/1992 proposes a method wherein the surface of a metal powder is coated with a metal oxide. This method, however, is unsatisfactory in the antioxidation effect. Further, during the firing, the metal oxide inhibits the sintering of the metal powder. Furthermore, as a matter of fact, it is difficult to effectively coat the surface of the fine metal powder with the metal oxide, and strong aggregation is often created under some treatment conditions.

SUMMARY OF THE INVENTION

An object of the present invention is to provide a metal powder which is highly resistant to oxidation, not only during storage of the powder but also in the form of a paste or during firing of the paste and, in particular, during firing, is not oxidized until the temperature reaches a value at which at least the organic vehicle is fully burned out and removed.

Another object of the present invention is to provide a metal powder which does not undergo oxidation until the sintering at a high temperature is completed, preferably enabling firing to be conducted in an oxidizing atmosphere while controlling the sintering behavior of the metal and, in addition, when used in multilayer components, does not create defects such as delamination and cracking.

A further object of the present invention is to provide a simple and improved process for preparing such a powder.

According to one aspect of the present invention, there is provided a metal powder having a vitreous thin layer on at least a part of the surface thereof.

In the present invention, the amount of the vitreous thin layer in the metal powder with a vitreous thin layer is preferably 0.01 to 50% by weight based on the metal powder without the vitreous thin layer. Throughout the specification, the amount of the vitreous thin layer is indicated based on the metal powder (excluding the vitreous thin layer), i.e., the weight of the major metal of the powder, unless otherwise specified.

According to another aspect of the present invention, there is provided a process for preparing a metal powder having a vitreous thin layer on at least a part of the surface thereof, comprising the steps of: bringing a solution comprising at least one heat-decomposable metal compound to fine droplets; and heating the droplets to a temperature above the decomposition temperature of the metal compound, wherein at least one precursor of an oxide, heat-decomposable to produce a vitreous material which, together with the metal, does not form a solid solution, is added to the solution and the vitreous material is deposited, upon the heating, in vicinity of the surface of the metal powder.

Further, the present invention provides a conductor paste comprising the metal powder having a vitreous thin layer on at least a part of the surface thereof and a multilayer ceramic electronic component comprising a conductor layer formed using the paste.

DETAILED DESCRIPTION OF THE PREFERRED EMBODIMENTS

The present invention will be described in more detail.

In the present invention, the term "metal powder" refers to not only a powder of a simple metal but also an alloy powder.

The vitreous thin layer, when is present on the surface of the metal powder, functions as a layer for protecting the metal against oxidation. The vitreous thin layer according to the present invention may be an amorphous layer or may be a crystal-containing amorphous layer so far as it has a glass transition point and a glass softening point and can be fluidized at a high temperature. There is no need for the vitreous thin layer to cover the whole surface of the metal powder, and the deposition of the vitreous thin layer in an effective amount suffices for the contemplated effect. Specifically, the amount of the vitreous thin layer is about 0.01 to 50% by weight based on the metal powder.

The component forming the vitreous thin layer produces oxides, which is, when heat decomposed, hardly dissolves in the metal powder and can be vitrified under metal powder producing conditions according to the present invention. Examples of these components may be at least one member selected from the group consisting of glass components commonly used as inorganic binders in thick film pastes, for example, oxides of elements, such as silicon, boron, phosphorus, germanium, tin, lead, bismuth, alkali metals, alkaline earth metals, copper, zinc, cadmium, aluminum, indium, titanium, zirconium, vanadium, niobium, tantalum, chromium, molybdenum, tungsten, manganese, rare earth elements, iron, and cobalt.

The composition and physical properties (e.g., softening point) of the vitreous thin layer may be suitably regulated according to the kind and applications of the paste. Preferably, during the firing of the paste, the vitreous thin layer does not soften and fluidize until the temperature reaches at least the decomposition temperature of the vehicle. This enables the vehicle to be fully oxidation decomposed and driven off without oxidizing the metal powder, even in an oxidizing atmosphere.

When the softening point of the glass is properly regulated by controlling the composition, the glass does not inhibit the sintering of the metal powder at a high temperature and rather accelerates the sintering at the high temperature. Specifically, as with a glass powder usually incorporated as an inorganic binder in a paste, a glass, which, after the step of removing the binder, softens at a relatively low temperature, such as lead borosilicate, lead zinc borosilicate, lead aluminum borosilicate, lead cadmium borosilicate, bismuth borosilicate, lead borate, lead zinc borate, and lead germanate, rapidly softens and fluidize to function as a sintering aid.

When use of the paste in an internal conductor of a multilayer electronic component or a multilayer substrate, or a co-firable external conductor and the like is contemplated, a composition, which does not fluidize until the temperature reaches a relatively high temperature, may be selected. For example, use of a material (e.g., lead silicate, zinc borate, alkaline earth metal borate, alkaline earth metal borosilicate, alkaline earth metal silicate, alkali metal borosilicate glasses or the like), which does not fluidize and is present on the surface of the powder to continuously exhibit the antioxidant action until the ceramic layer is densified to some extent, enables the co-firing of a base metal conductor and ceramic in an oxidizing atmosphere. In the case of a palladium conductor, oxidation during firing can be retarded, preventing delamination and cracking.

Further, also when there is no problem of oxidation of the metal powder, too early initiation of sintering of the metal powder and not the ceramic during the co-firing of the metal powder and the ceramic layer causes the uncoincidence of sintering and shrinking behavior between the metal powder and the ceramic, creating structural defects, such as delamination and cracking, and warpage of the multilayer ceramic substrate. In this case, use of a vitreous material, which does not soften until the sintering initiation temperature of the ceramic layer, can inhibit sintering of the metal powder to delay the initiation of sintering, preventing delamination, cracking, etc.

In any of the above cases, after firing, the glass is moved from the surface of the metal powder to the substrate or dielectric layer side and is present at the interface between the substrate or dielectric layer and the conductor film, thereby enhancing the adhesion between the substrate or dielectric layer and the conductor film.

The presence of glass in a relatively large amount on the surface of the metal powder poses no problem when the metal powder is used for a usual thick film conductor paste. The presence of the glass in an excessively large amount increases the amount of the content of the insulating component in the fired film, often sacrificing the conductivity and solderability of the film and other properties, thereby necessitating proper regulation of the amount of the glass according to the application and necessary properties. In particular, when the metal powder is used for an internal conductor of a multilayer component, the amount of the glass on the surface of the metal powder is preferably as small as possible.

The metal powder having a surface on which a vitreous thin layer is formed is preferably made of a noble metal, such as silver, gold, platinum, or palladium, or a base metal, such as copper, nickel, cobalt, iron, aluminum, molybdenum, or tungsten, and an alloy or mixture thereof. The present invention is particularly useful for an oxidizable metal from the viewpoint of the effect of preventing the oxidation. However, the metal powder is not limited to the oxidizable metal.

The powder of the present invention is preferably prepared by a spray pyrolysis method. As described in Japanese Patent Publication No. 31522/1988, Japanese Patent Laid-Open Nos. 172802/1994 and 279816/1994 and the like, in the spray pyrolysis method, a solution containing at least one heat-decomposable metal compound is atomized to form fine droplets which are heated at a temperature above the decomposition temperature of the metal compound, preferably a temperature around the melting point of the metal or above to heat-decompose the metal compound, thereby depositing a metal or alloy powder.

This method can provide a metal or alloy powder having good crystallinity, high density, and high dispersibility and can easily control the particle size. In addition, when a precursor of the oxide is previously added to the metal compound solution as a starting solution, the formation of the powder and the coating of the glass can be simultaneously conducted, advantageously eliminating the need to additionally provide the step of coating. That is, the metal powder prepared by the spray pyrolysis has good crystallinity, has no significant defects in the interior of the metal particle and hardly contains grain boundaries. Therefore, the oxide deposited by the heat decomposition is less likely to deposit in the interior of the metal particle, expelled from the interior of the metal particle, segregated in a high concentration in the vicinity of the surface, and vitrified. The deposited vitreous material relatively evenly covers the surface and, hence, even when it is present in a small amount, can function as a layer for protecting the metal particle against oxidation and sintering. In the spray pyrolysis method, the metal composition of the resultant particles is in agreement with that of the metal composition in the starting solution, making it easy to control the composition, which in turn renders the spray pyrolysis method suitable for the preparation of the powder of the present invention.

In the process of the present invention, the starting compound of the metal powder may be at least one heat decomposable salt selected from the group consisting of a salt of nitric acid, a salt of sulfuric acid, a chloride, an ammonium complex, a salt of phosphoric acid, a salt of a carboxylic acid, a metal alcoholate, and a metal resinate, or a double or complex salt thereof. Use of a mixture of at least two metal salts can offer an alloy or mixed powder.

The metal compound as the major component is dissolved in water or an organic solvent, an alcohol, acetone or an ether, or a mixed solvent thereof to prepare a solution, and at least one oxide precursor of the vitreous material is added to the solution.

The oxide precursor used in the present invention produce, through heat decomposition, an oxide which hardly dissolves in the metal powder and can be vitrified under metal powder producing conditions according to the present invention. The oxide precursor may be suitably selected from, for example, boric acid, silicic acid, phosphoric acid, various salts of boric acid, silicic acid and phosphoric acid, heat-decomposable salts, such as a nitrate, a sulfate, a chloride, an ammonium complex, a phosphate, a carboxylate, an alcoholate, and a resinate of various metals, and double or complex salts thereof.

The mixed solution comprising of the metal compound as the major component and the oxide precursor is brought to fine droplets through an atomizer, such as an ultrasonic atomizer or a twin-fluid atomizer, followed by heating at a temperature above the decomposition temperatures of the metal compound and the oxide precursor to conduct heat decomposition. Preferably, the heat treatment is conducted at the melting point of the metal as the major component or a higher temperature. However, a temperature about 200° C. below the melting point suffices for the expelling effect. In particular, when a high density, uniform shape or the like is not required, the heating temperature may be considerably below the melting point. The atmosphere at the time of heating may be suitably selected from oxidizing, reducing and inert atmospheres depending upon the kind of the metal and oxide precursor, heating temperature and the like.

Regarding the amount of the oxide precursor added, addition of the oxide precursor in an amount of less than 0.01% by weight, in terms of oxide based on the metal powder, cannot offer any effect. On the other hand, when the amount of the oxide precursor is excessively large, segregation is less likely to occur on the surface. The amount of the oxide precursor added, although it varies depending upon the density of the vitreous material deposited, is preferably up to about 50% by weight from the practical viewpoint. It is particularly preferably in the range of from 0.05 to 20% by weight.

If necessary, after the formation of the powder, at least a part of the vitreous thin layer deposited on the surface of the powder may be removed by washing, etching or other methods to regulate the coverage of the vitreous thin layer.

Thick film pastes, such as a conductor paste and a resistor paste, comprising the metal powder of the present invention as a conductive component may be prepared by the conventional method. If necessary, other conductive powders and inorganic binders, such as glass powder, and other additives may be incorporated into the metal powder of the present invention.

The present invention will be described in more detail with reference to the following Examples and Comparative Examples.

EXAMPLES 1 TO 3

Nickel nitrate hexahydrate was dissolved in water to a nickel concentration of 50 g/liter, and barium nitrate and boric acid were added to the solution to prepare starting solutions containing barium and boron, in the form BaO and $B_2O_3$ based on the nickel element specified in Table 1.

The starting solution thus prepared was brought to fine droplets through an ultrasonic atomizer, and the droplets were fed with the aid of a gas, regulated to have a weakly reducing property, as a carrier into a ceramic tube heated to 1,400° C. in an electric furnace. The droplets were heat decomposed in the course of passing through a heating zone to prepare a nickel powder containing barium oxide and boron oxide.

The resultant powders were collected and analyzed by X-ray diffractometry. As a result, for all the powders, any diffraction line other than diffraction lines derived from nickel and a very small amount of nickel oxide was not detected. When the powder was washed with a 5% dilute hydrochloric acid, dissolution of nickel hardly occurred, whereas the amount of the additives in the powder after the washing was reduced by at least 80%. This indicates that the added barium and boron are segregated in a high concentration on the surface of the nickel particles and, as analyzed by X-ray diffractometry, are found to be present in the state of amorphous $BaO—B_2O_3$ glass.

The oxidation initiating temperature and the sintering initiating temperature of the powder were evaluated by thermogravimetry (TG) in the air and by thermomechanical analysis (TMA) in a reducing atmosphere, and the results are given in Table 1. The oxidation initiation temperature is the temperature necessary for providing a 1% weight increase in the TG measurement. The sintering initiation temperature is the shrinking initiation temperature in the TMA measurement.

Comparative Example 1

A pure nickel powder was prepared in the same manner as in Example 1, except that neither barium nitrate nor boric acid was added. The properties of the resultant powder are given in Table 1.

Comparison of the results of Examples 1 to 3 with the results of Comparative Example 1 shows that the presence of $BaO—B_2O_3$ glass increases the oxidation initiation temperature by 50 to 240° C., confirming the effect of improving the oxidation resistance. Further, the sintering initiation temperature also is increased by 220 to 250° C. to 590 to 620° C., indicating that since the softening point of the $BaO—B_2O_3$ glass having this composition is 600 to 610° C., the sinterability of the powder can be regulated by varying the softening point of the vitreous material.

EXAMPLE 4

A nickel powder having a $CaO—Al_2O_3—B_2O_3$ glass on the surface thereof was prepared in the same manner as in Example 1, except that calcium nitrate tetrahydrate, aluminum nitrate nonahydrate, and boric acid in respective amounts in terms of $CaO$, $Al_2O_3$, and $B_2O_3$, based on the nickel element as specified in Table 1 were added.

The oxidation initiation temperature and the sintering initiation temperature were measured in the same manner as in Example 1, and the results are also given in Table 1. As a result, the sintering initiation temperature as measured by TMA was 770° C., while the softening point of $CaO—Al_2O_3—B_2O_3$ glass having this composition was 735 to 800° C., here again indicating that the sinterability of the powder can be regulated by varying the softening point of the vitreous material.

EXAMPLE 5

A nickel powder having a $BaO—SiO_2$ glass on the surface thereof was prepared in the same manner as in Example 1, except that barium nitrate, tetraalkoxysilane, and an alcohol, for dissolving the tetraalkoxysilane, in respective amounts specified in Table 1 were added.

The oxidation initiation temperature and the sintering initiation temperature are also given in Table 1.

EXAMPLE 6

Copper nitrate trihydrate was dissolved in water to a copper concentration of 50 g/liter, and barium nitrate and boric acid in respective amounts, in terms of $BaO—B_2O_3$ based on the copper element, as specified in Table 1 were added to prepare starting solutions. The procedure of Example 1 was repeated to bring the solution to fine droplets, followed by heat decomposition at 1,100° C. to prepare a copper powder with $BaO—B_2O_3$ glass present on the surface thereof.

The oxidation initiation temperature and the sintering initiation temperature of the resultant powder are given in Table 1.

Comparative Example 2

A pure copper powder was prepared in the same manner as in Example 6, except that neither barium nitrate nor boric acid was added.

The oxidation initiation temperature and the sintering initiation temperature are given in Table 1.

TABLE 1

| | Melt powder | Additive element and amount of additive element added based on metal powder (in terms of oxide, wt %) | Oxidation initiation temperature (° C.) | Sintering initiation temperature (° C.) |
| --- | --- | --- | --- | --- |
| Ex. 1 | Ni | Ba 0.05 B 0.02 | 440 | 590 |
| Ex. 2 | Ni | Ba 0.40 B 0.70 | 530 | 620 |
| Ex. 3 | Ni | Ba 3.90 B 7.10 | 630 | 590 |
| Ex. 4 | Ni | Ca 6.00 Al 3.00 B 1.00 | 550 | 770 |
| Ex. 5 | Ni | Ba 0.50 Si 0.50 | 450 | 750 |
| Comparative Ex. 1 | Ni | — | 390 | 370 |
| Ex. 6 | Cu | Ba 4.00 B 6.00 | 510 | 600 |
| Comparative Ex. 2 | Cu | — | 300 | 310 |

In the metal powder having a vitreous thin layer on the surface thereof according to the present invention, even in the case of an easily oxidizable metal, such as a base metal, oxidation during storage and firing of the paste can be effectively prevented.

In particular, selection of the glass, which is not fluidized until the temperature becomes high, enables even a base metal paste to be fired in an oxidizing atmosphere throughout the whole step, realizing a low cost and eliminating the need to carefully control the atmosphere and the temperature. This enables the preparation of a product which, even when used in a multilayer component, causes no deteriorated dielectric properties and has a high reliability.

Further, selection of the composition of the vitreous material enables functions, such as retardation or acceleration of the sintering of the paste and improvement in adhesion, to be properly regulated, realizing the preparation of a conductor film having an excellent adhesion without sacrificing the conductivity, solderability and other properties. Since the vitreous material is fluidized and removed from the surface of the powder after the sintering, the influence on the properties is lower than that in the conventional coating or addition of an oxide.

Further, when the paste and the ceramic are co-fired, the glass can serve to prevent the oxidation and, in addition, serve as a layer for protecting the metal powder against sintering. Bringing the shrinking behavior in sintering of the metal powder to that of the ceramic layer enables the preparation of a multilayer component and a multilayer substrate free from a structural defect.

Further, according to the spray pyrolysis method used in the present invention, when a glass forming component is previously added to a starting solution, metal powders having vitreous thin layers of various compositions can be simply prepared by one-stage spray pyrolysis.

What is claimed is:

1. A metal powder having a vitreous thin layer on at least a part of the surface thereof.

2. The metal powder according to claim 1, wherein the amount of the vitreous thin layer is 0.01 to 50% by weight based on the metal powder, excluding the vitreous thin layer.

3. A process for preparing the metal powder according to claim 1, comprising the steps of: bringing a solution comprising at least one heat-decomposable metal compound to fine droplets; and heating the droplets to a temperature above the decomposition temperature of the metal compound, wherein at least one precursor of an oxide, heat-decomposable to produce a vitreous material which, together with the metal, does not form a solid solution, is added to the solution and the vitreous material is deposited, upon the heating, in the vicinity of the surface of the metal powder.

4. A conductor paste comprising the metal powder according to claim 1.

5. A multilayer ceramic electronic component comprising a conductor layer formed using the conductor paste according to claim 4.

6. A multilayer ceramic substrate comprising a conductor layer formed using the conductor paste according to claim 4.

7. The metal powder according to claim 1, wherein the vitreous thin layer comprises a glass.

8. The metal powder according to claim 1, wherein the vitreous thin layer does not form a solid solution with the metal of the metal powder.

9. The metal powder according to claim 7, wherein the glass comprises BaO and $B_2O_3$.

10. The metal power according to claim 9, wherein the metal of the metal powder is nickel.

11. The metal powder according to claim 7, wherein the glass comprises CaO, $Al_2O_3$ and $B_2O_3$.

12. The metal powder according to claim 7, wherein the glass comprises BaO and $SiO_2$.

13. The metal powder according to claim 1, wherein the metal of the metal powder is nickel.

* * * * *